United States Patent
Zhang

(10) Patent No.: US 8,885,384 B2
(45) Date of Patent: Nov. 11, 2014

(54) MASK-PROGRAMMED READ-ONLY MEMORY WITH RESERVED SPACE

(71) Applicant: ChengDu HaiCan IP Technology LLC, ChengDu (CN)

(72) Inventor: Guobiao Zhang, Corvallis, OR (US)

(73) Assignees: ChengDu HaiCun IP Technology LLC, ChengDu, SiChuan (CN); Guobiao Zhang, Corvallis, OR (US)

(*) Notice: Subject to any disclaimer, the term of this patent is extended or adjusted under 35 U.S.C. 154(b) by 0 days.

(21) Appl. No.: 13/846,928

(22) Filed: Mar. 18, 2013

(65) Prior Publication Data

US 2013/0227204 A1 Aug. 29, 2013

Related U.S. Application Data

(63) Continuation-in-part of application No. 13/396,596, filed on Feb. 14, 2012, now abandoned, which is a continuation-in-part of application No. 12/883,172, filed on Sep. 15, 2010, now abandoned, which is a continuation-in-part of application No. 11/736,773, filed on Apr. 18, 2007, now abandoned.

(60) Provisional application No. 60/884,618, filed on Jan. 11, 2007.

(51) Int. Cl.
*G11C 17/10* (2006.01)

(52) U.S. Cl.
USPC .......................... 365/103; 365/164; 257/390

(58) Field of Classification Search
USPC ............ 365/94, 100, 102, 103, 105; 257/390, 257/E33.012; 69/94, 100, 102, 103, 105
See application file for complete search history.

(56) References Cited

U.S. PATENT DOCUMENTS

| | | |
|---|---|---|
| 4,939,568 A | 7/1990 | Kato et al. |
| 5,404,485 A | 4/1995 | Ban |
| 5,408,672 A | 4/1995 | Miyazawa et al. |
| 5,468,983 A | 11/1995 | Hirase et al. |
| 5,835,396 A | 11/1998 | Zhang |
| 5,843,824 A | 12/1998 | Chou et al. |
| 5,847,442 A | 12/1998 | Mills, Jr. et al. |
| 5,901,330 A | 5/1999 | Sun et al. |
| 5,943,255 A | 8/1999 | Kutter et al. |
| 6,055,180 A | 4/2000 | Gudesen et al. |
| 6,461,906 B1 | 10/2002 | Lung |
| 6,496,978 B1 | 12/2002 | Ito |
| 6,624,485 B2 | 9/2003 | Johnson |
| 6,633,999 B1 | 10/2003 | Lee |
| 6,647,471 B2 | 11/2003 | March et al. |
| 6,717,222 B2 | 4/2004 | Zhang |
| 6,794,253 B2 | 9/2004 | Lin et al. |
| 6,853,028 B2 | 2/2005 | Kim et al. |
| 6,903,427 B2 | 6/2005 | Zhang |
| 7,000,063 B2 | 2/2006 | Friedman et al. |
| 7,062,602 B1 | 6/2006 | Moore et al. |
| 7,174,537 B2 | 2/2007 | Ito |
| 7,573,795 B2 | 8/2009 | Hwang et al. |
| 7,639,581 B2 | 12/2009 | Hwang et al. |
| 7,728,391 B2 | 6/2010 | Zhang |
| 7,821,080 B2 | 10/2010 | Zhang |

(Continued)

*Primary Examiner* — Douglas King

(57) ABSTRACT

The present invention discloses a mask-ROM with reserved space (mask-ROM$_{RS}$). For small content revision, the present invention salvages the original data-mask by writing the data-pattern of new content into a reserved mask-region which originally has no data-pattern.

11 Claims, 4 Drawing Sheets

(56) References Cited

U.S. PATENT DOCUMENTS

| | | |
|---|---|---|
| 7,861,030 B2 | 12/2010 | Davis |
| 2002/0027281 A1 | 3/2002 | Goto |
| 2002/0083390 A1 | 6/2002 | Lee et al. |
| 2004/0007746 A1* | 1/2004 | Zhang .......................... 257/390 |
| 2004/0098416 A1 | 5/2004 | Moore et al. |

* cited by examiner

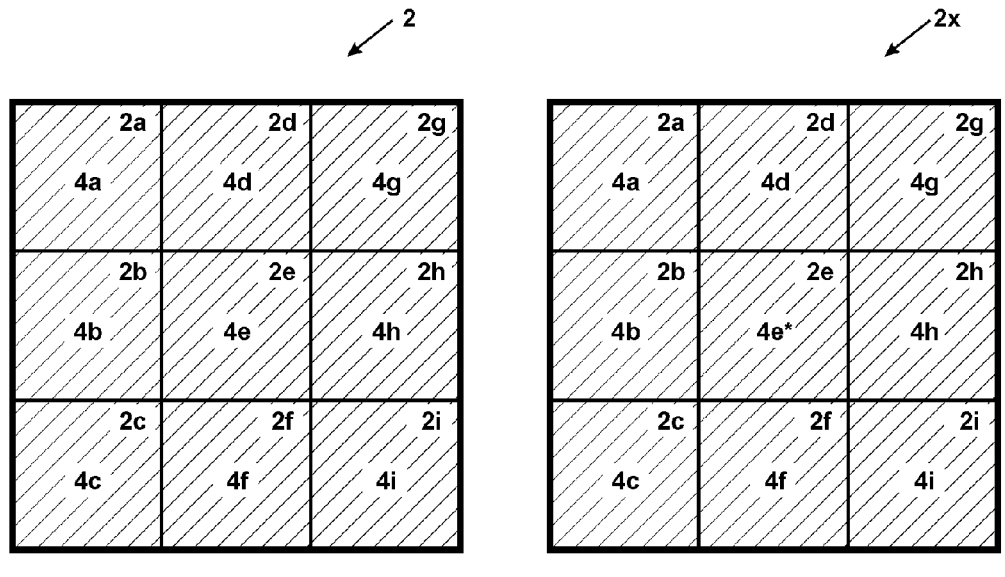
Fig. 1A
(Prior Art)
Fig. 1B
(Prior Art)
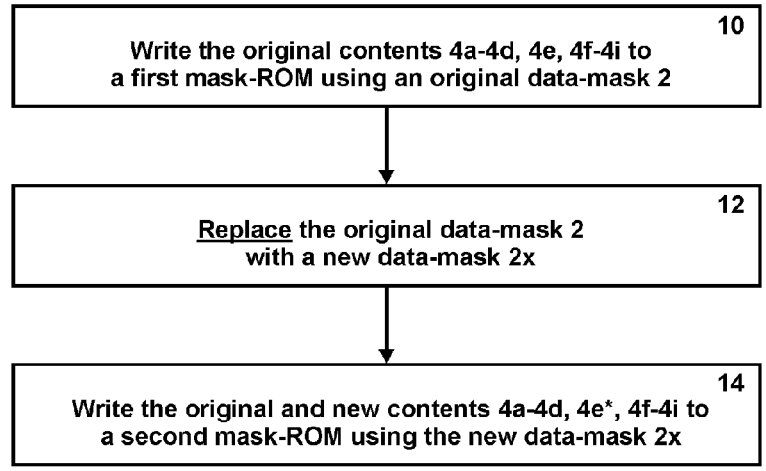
Fig. 1C
(Prior Art)

LA = logical address
PA = physical address

MASK-PROGRAMMED READ-ONLY MEMORY WITH RESERVED SPACE

CROSS-REFERENCE TO RELATED APPLICATIONS

This application is a continuation-in-part of U.S. patent application Ser. No. 13/396,596, "Mask-Programmable Memory with Reserved Space", filed Feb. 14, 2012, which is a continuation-in-part of U.S. patent application Ser. No. 12/883,172, "Three-Dimensional Mask-Programmable Memory with Reserved Space", filed Sep. 15, 2010, which is a continuation-in-part of U.S. patent application Ser. No. 11/736,773, "Mask-Programmable Memory with Reserved Space", filed Apr. 18, 2007, which is a non-provisional application of a U.S. Patent Application Ser. No. 60/884,618, "Mask-Programmable Memory with Reserved Space", filed Jan. 11, 2007.

BACKGROUND

1. Technical Field of the Invention

The present invention relates to the field of integrated circuits, and more particularly to mask-programmed read-only memory (mask-ROM).

2. Prior Arts

For a mask-programmed read-only memory (mask-ROM), content is written using at least one data-mask during manufacturing process (step 10 of FIG. 1C). For example, a data-mask 2 comprises a plurality of mask-regions 2$a$-2$i$, whose patterns represent content data 4$a$-4$i$ (FIG. 1A). Hereinafter, the pattern representing content data is referred to as data-pattern. Being permanently formed, the data-patterns cannot be modified once written onto the data-mask 2.

In prior art, whenever a new content needs to be included in a mask-ROM, a new data-mask 2$x$ needs to be made to replace the original data-mask 2 (step 12 of FIG. 1C). For example, the new data-mask 2$x$ includes the data-pattern of the new content 4$e$* in the mask-region 2$e$ (FIG. 1B), as well as the data-patterns for the original contents 4$a$-4$d$, 4$f$-4$i$. The original and new contents 4$a$-4$d$, 4$e$*, 4$f$-4$i$ are written to a second batch of mask-ROMs using the new data-mask 2$x$ (step 14 of FIG. 1C).

As technology advances, data-mask becomes more and more expensive. For example, a 22 nm data-mask costs ~$260 k. In addition, a data-mask contains more and more data. For example, a 22 nm data-mask contains up to ~155 GB data. Some of these data will likely be revised at a future point of time. Replacing a whole data-mask for small data revision is costly. To overcome this and other drawbacks, the present invention discloses a mask-ROM with reserved space (mask-ROM$_{RS}$).

OBJECTS AND ADVANTAGES

It is a principle object of the present invention to provide a mask-ROM that can economically accommodate small content revision.

It is a further object of the present invention to provide a mask-ROM which salvages the original data-mask for small content revision.

In accordance with these and other objects of the present invention, a mask-ROM with reserved space (mask-ROM$_{RS}$) is disclosed.

SUMMARY OF THE INVENTION

The present invention discloses a mask-ROM with reserved space (mask-ROM$_{RS}$). For small content revision, the present invention salvages the original data-mask instead of discarding it. On its original data-mask, at least one mask-region is reserved for a future new content and has no data-pattern. Being un-patterned, the reserved mask-region can be used to write the data-pattern of the new content. This differs from prior art. In prior art, because all mask-regions have been written, there is no un-patterned mask-region on the data-mask to write the data-pattern of the new content into.

The mask-ROM$_{RS}$ comprises first and second portions. In its original version, the first portion stores an original content, while its second portion stores no content and forms a reserved space. In its updated version, the second portion stores the new content. In the present invention, both the updated and the original mask-ROM$_{RS}$ use the same data-mask (although with revision), not two different data-masks. Because the original data-mask is salvaged instead of being discarded, little extra mask cost is incurred for small content revision. Here, small content revision means the amount of new content that is to be included at a future point of time is substantially less than the original contents.

BRIEF DESCRIPTION OF THE DRAWINGS

FIGS. 1A-1B illustrate original and new data-masks in prior art; FIG. 1C discloses a data-writing method to the original and new mask-ROMs in prior art;

Figures 2A, 2B:
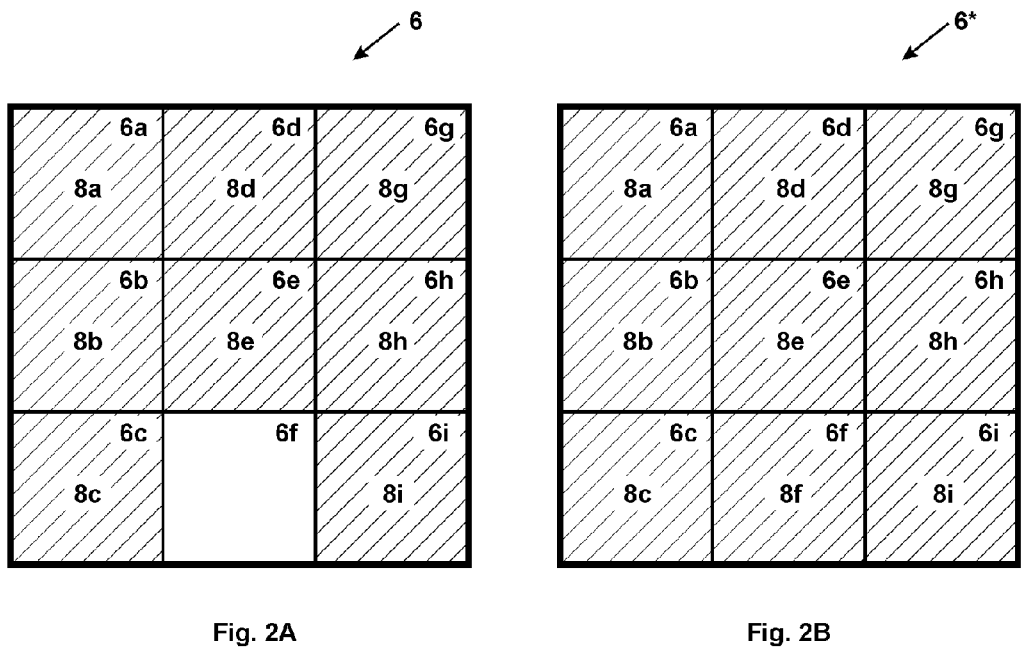
FIGS. 2A-2B illustrate exemplary original and updated data-masks 6, 6*.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

In this specification, the term "original" refers to the first version of the mask-ROM, which stores an initial collection of contents, i.e. original contents. The term "updated" refers to the second version of the mask-ROM, which stores a large portion of the original contents, plus at least a new content. The new content could be included as an additional content, which adds to the original contents; or as an upgrade content, which replaces an outdated content in the original contents.

In this specification, "content" can be broadly interpreted as a standalone content or a component thereof. Here, "standalone content" refers to information which, by itself, provides value for an end-user in specific context. A content could be a single file or a collection of files. One example of content is a multimedia content, including a textual content, an audio content, an image content (e.g. a digital map) and/or a video content (e.g. a movie, a TV program, a video game). Another example of content is a computer program, including an operating system, a computer software for computers and/or an application software for cellular phones.

The present invention discloses a mask-ROM with reserved space (mask-ROM$_{RS}$). For small content revision, the present invention salvages the original data-mask instead of discarding it. On its original data-mask, at least one mask-region is reserved for a future new content and has no data-pattern. Being un-patterned, the reserved mask-region can be used to write the data-pattern of the new content. Here, small content revision means the amount of new content that is to be included at a future point of time is substantially less than the original contents.

Figure 2C:
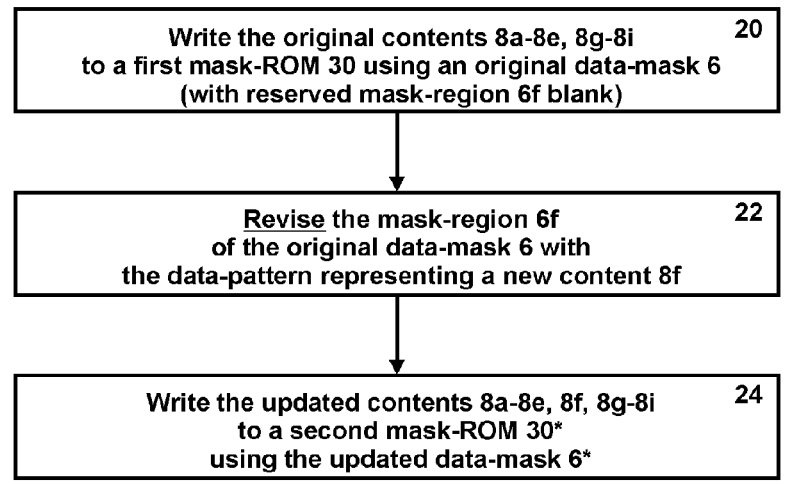
FIG. 2C discloses a preferred data-writing method to the original and updated mask-ROM$_{RS}$'s.

Referring now to FIGS. 2A-2C, the original and updated data-masks used for a preferred mask-ROM$_{RS}$ and a preferred data-writing method are disclosed. The original data-mask 6 comprises a plurality of mask-regions 6a-6i (FIG. 2A). Most mask-regions 6a-6e, 6g-6i have data-patterns representing data for the original contents 8a-8e, 8g-8i. However, at least one mask-region 6f is reserved for at least a future new content and has no data-pattern. This mask-region 6f is blank, i.e. either all dark or all clear. The original contents 8a-8e, 8g-8i are written into a first batch of mask-ROM$_{RS}$'s (i.e. original mask-ROM$_{RS}$'s) using the original data-mask 6 (step 20 of FIG. 2C).

When a new content 8f needs to be included in an updated mask-ROM$_{RS}$, the data-pattern representing this new content 8f is written to the reserved mask-region 6f (step 22 of FIG. 2C). As a result, the updated data-mask 6* contains the data-patterns representing the original contents 8a-8e, 8g-8i plus the new content 8f (FIG. 2B). These contents 8a-8e, 8f, 8g-8i are written into a second batch of mask-ROM$_{RS}$'s (i.e. updated mask-ROM$_{RS}$'s) using the updated data-mask 6* (step 24 of FIG. 2C). In the present invention, the first and second batches of mask-ROM$_{RS}$'s use the same data-mask 6 (although with revision), not two different data-masks 2 and 2x as in prior art. Because the original data-mask 6 is salvaged instead of being discarded, little extra mask cost is incurred for small content revision.

To make it economically feasible to salvage the original data-mask, the original contents should occupy a substantial portion of the original data-mask, preferably at least 50% of the original data-mask. On the other hand, when revising the original data-mask 6, it is crucial to write the data-pattern of the new content into an un-patterned mask-region 6f. This differs from prior art. In prior art, because all mask-regions have been written, there is no un-patterned mask-region on the data-mask to write the data-pattern of the new content into.

Figure 3A:
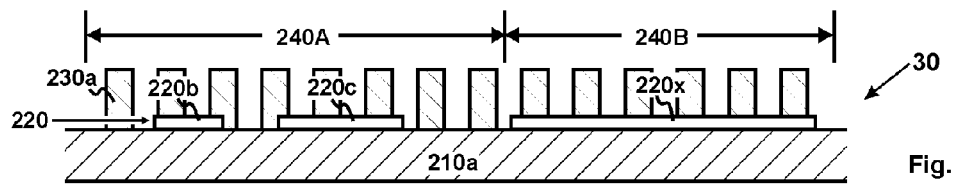
FIGS. 3AA-3AB are different views of an original mask-ROM$_{RS}$ array 30.
Figure 3A:
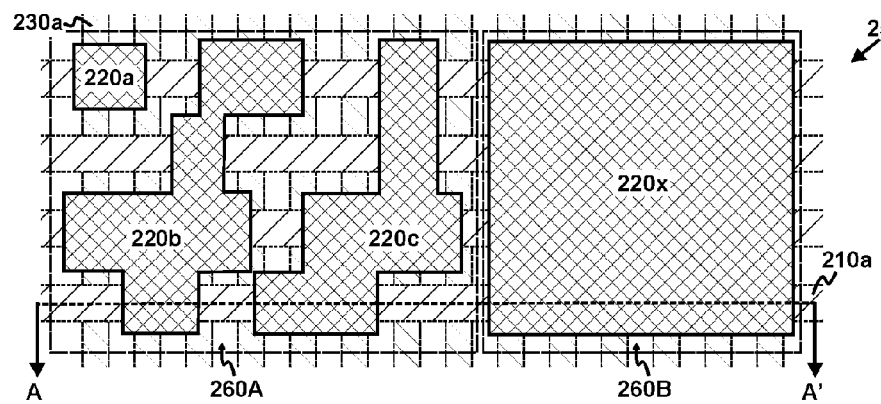

Referring now to FIGS. 3AA-3BB, an exemplary mask-ROM$_{RS}$ array in its original and updated versions is disclosed. The mask-ROM$_{RS}$ array 30 (or 30*) comprises a plurality of lower address lines (210a . . . ) and upper address line (230a . . . ) and mask-ROM cells. Each memory cell further comprises at least a data-layer 220, where the existence or absence of a contact via determines the digital state of the memory cell. Examples of the data-layer include an insulating dielectric or a resistive layer. The data-pattern of the data-layer is defined by the data-mask 6 (or 6*). For reason of simplicity, diodes, transistors and other memory components are not shown in FIGS. 3AA-3BB.

FIG. 3AA is a cross-sectional view of the original mask-ROM$_{RS}$ array 30 along the cut-line AA' of FIG. 3AB; FIG. 3AB is a top view of the data-pattern 250 of the data-layer 220 in the original mask-ROM$_{RS}$ array 30 and its relative placement with respect to the address lines 210a . . . ; 230a . . . . The mask-ROM$_{RS}$ array 30 comprises a first portion 240A and a second portion 240B. The first portion 240A corresponds to the region 260A of the data-layer 250, which has data-patterns 220a-220c. Accordingly, the memory cells in the first portion 240A are associated with a plurality of data blocks. They store the original content and form the original data space. On the other hand, the second portion 240B corresponds to the region 260B of the data-layer 250, which has no data-pattern, or just an all-dark pattern 220x. Accordingly, the memory cells in the second portion 240B are associated with a plurality of empty blocks. They store no content and form a reserved space. Here, a "block" is the smallest allocation unit of a memory that can be addressed by a user (or, a host). A "data block" is a block whose data has been written, while an "empty block" is a block whose data has not been written. To make it economically feasible to salvage the original data-mask, the total number of the memory cells in the first portion 240A is more than the total number of the memory cells in the second portion 240B in this preferred embodiment.

Due to the rules governing memory allocation, slack space cannot be avoided in a mask-ROM. Although both contain empty blocks, slack space in prior art can be easily distinguished from the reserved space of the present invention. Because it is wasteful, prior art purposely minimizes slack space in a mask-ROM, generally to under 1% of the total memory space. In contrast, the present invention purposely includes a reserved mask-region associated with the reserved space to accommodate a future new content. To further distinguish the present invention from prior art, the reserved space is preferably more than 10% of the total memory space. Namely, the reserved mask-region preferably occupies at least 10% of the original data-mask. Because memory cells are uniformly distributed in a mask-region, this implies that the total number of the memory cells in the second portion 240B is roughly more than ~10% of the total number of the memory cells in the first portion 240A.

Figure 3B:
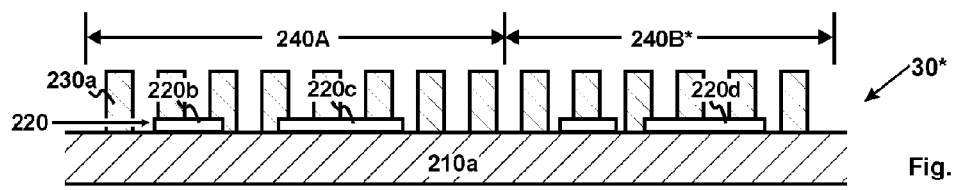
FIGS. 3BA-3BB are different views of an updated mask-ROM$_{RS}$ array 30*.
Figure 3B:
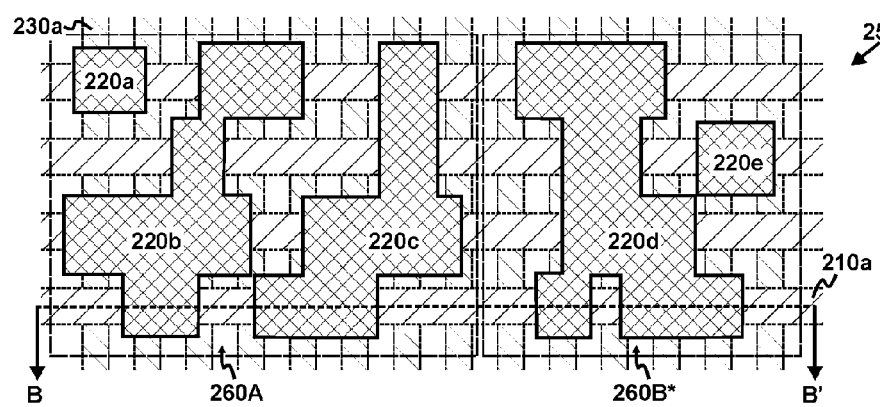

FIG. 3BA is the cross-sectional view of the updated mask-ROM$_{RS}$ array 30* along the cut-line BB' of FIG. 3BB; FIG. 3BB is the top view of the updated data-pattern 250* of the data-layer 220 and its relative placement with respect to the address lines 210a . . . ; 230a . . . . Here, the original data-patterns 220a-220c remain the same. However, updated data-patterns 220d, 220e representing the new content are written into the region 260B* of the data-layer 220. Accordingly, the memory cells in the second portion 240B* stores the new content.

Figure 4:
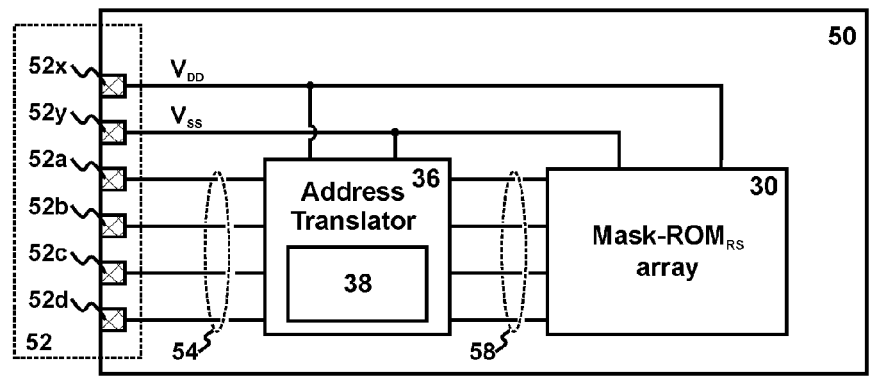
FIG. 4 is a circuit block diagram of a preferred mask-ROM$_{RS}$.
Figure 5A:
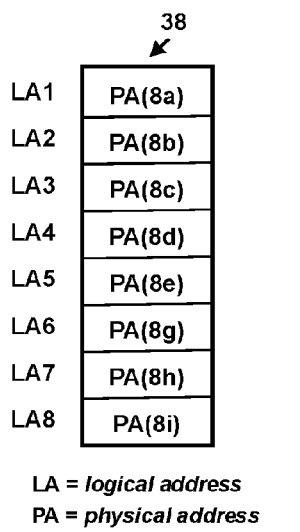
FIG. 5A discloses an exemplary address-mapping table of an original mask-ROM$_{RS}$.
Figure 5B:
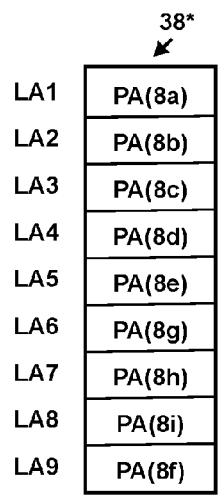
FIGS. 5B-5C disclose exemplary address-mapping tables of two updated mask-ROM$_{RS}$'s.
Figure 5C:
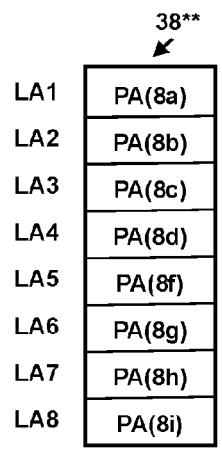

Referring now to FIGS. 4-5C, a preferred mask-ROM$_{RS}$ 50 and its address-mapping tables are shown. As illustrated in FIG. 4, the preferred mask-ROM$_{RS}$ 50 includes an interface 52 for physically connecting to and electrically communicating with a variety of hosts. The interface 52 includes contacts 52x, 52y, 52a-52d which are coupled to corresponding contacts in a host receptacle. For example, the host provides a voltage supply $V_{DD}$ and a ground voltage $V_{SS}$ to the mask-ROM$_{RS}$ 50 through the power contact 52x and the ground contact 52y, respectively; the host further exchanges address/data with the mask-ROM$_{RS}$ 50 through signal contacts 52a-52b. Here, a host is an apparatus that directly uses the mask-ROM$_{RS}$ 50, and the address/data used by the host are logical address/data.

The preferred mask-ROM$_{RS}$ 50 comprises at least a mask-ROM$_{RS}$ array 30 and an address translator 38. The mask-ROM$_{RS}$ array 30 is similar to those disclosed in FIGS. 3AA-3BB. The address translator 38 converts logical addresses from the host to physical addresses of the mask-ROM$_{RS}$ array 30. Here, the logical addresses are represented on an internal bus 58, while the physical addresses are represented on an external bus 54 (including signals from contacts 52a-52d). The address translator 38 comprises a non-volatile memory (NVM) for storing an address mapping table 38, which maintains links between the logical addresses and the physical addresses. During read, upon receiving the logical address for the memory block to be read, the address translator 36 looks up the address mapping table and fetches the physical address corresponding to the logical address.

The preferred mask-ROM$_{RS}$ 50 could comprise a plurality of mask-ROM$_{RS}$ arrays. In addition, the mask-ROM$_{RS}$ 30 and the address translator 36 could be formed on separate dies or on a single die. When formed on separate dies, the mask-ROM$_{RS}$ array die and the address translator die could be vertically stacked or mounted side-by-side. They could form a multi-chip package (MCP) or a multi-chip module (MCM).

FIGS. 5A-5C disclose three exemplary address-mapping tables. Each address-mapping table comprises a plurality of entries. The addresses of these entries are logical addresses, while the data stored in these entries are physical addresses of the content data associated with the logical addresses. For example, the entry at logical address LA1 includes the physical address PA(8a) of at least one memory block storing at least a portion of the content 8a.

The first address-mapping table 38 in FIG. 5A is for an original mask-ROM$_{RS}$ 30. Data are written into the original mask-ROM$_{RS}$ 30 using the original data-mask 6 of FIG. 2A. The entries at logical addresses LA1-LA8 include the physical addresses for the contents 8a-8e, 8g-8i, respectively.

The second address-mapping table 38* in FIG. 5B is for a first preferred updated mask-ROM$_{RS}$ 30*. Data are written into this updated mask-ROM$_{RS}$ 30* using the updated data-mask 6* of FIG. 2B. In this updated mask-ROM$_{RS}$ 30*, a new content 8f is added to the original content. Accordingly, a new entry is added to the logical address LA9 of the address-mapping table 38*. It contains the physical address PA(8f) for the content 8f. To add new entries, the NVM storing the address-mapping table 38* is preferably a writable memory, which can be programmed at least once. One example of the writable memory is an antifuse-based memory, or a flash memory.

The third address-mapping table 38** in FIG. 5C is for a second preferred updated mask-ROM$_{RS}$ 30*. Data are written into this updated mask-ROM$_{RS}$ 30* using the updated data-mask 6* of FIG. 2B. In this updated mask-ROM$_{RS}$ 30*, an upgrade content 8f is included to replace an outdated content 8e. Accordingly, the entry PA(8e) at LA5 is replaced by the physical address(es) PA(8f) for the content 8f. In other words, the address-mapping table 38 does not contain the physical address(es) of the outdated content 8e. To replace entries, the NVM storing the address-mapping table 38 is preferably a re-writable memory, which can be programmed many times. One example of the re-writable memory is a flash memory.

In the updated mask-ROM$_{RS}$ 30* of FIG. 5C, contents 8a-8d, 8g-8i are not replaced by any upgrade contents. They are referred to as permanent contents. To make it economically feasible to salvage the original data-mask, a substantial portion of the original data-mask should represent the permanent contents. In other words, the memory cells storing the permanent contents should be more than the memory cells storing the outdated content or the upgrade content, as is reflected in FIG. 5C.

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A mask-programmed read-only memory (mask- ROM) family, comprising:
 a first mask-ROM die comprising at least a first memory array; a second mask-ROM die comprising at least a second memory array; wherein said first and second memory arrays are same except for a reserved portion, said reserved portion comprising a same plurality of mask-ROM cells in said first and second memory arrays, wherein all mask-ROM cells in the reserved portion of said first memory array have a same structure, and the mask-ROM cells in the reserved portion of said second memory array have at least two structures.

2. The mask-ROM family according to claim 1, wherein all mask-ROM cells in the reserved portion of said first memory array comprise a data layer.

3. The mask-ROM family according to claim 1, wherein all mask-ROM cells in the reserved portion of said first memory array comprise no data layer.

4. The mask-ROM family according to claim 1, wherein at least selected mask-ROM cells in the reserved portion of said second memory array comprise a data layer.

5. The mask-ROM family according to claim 1, wherein at least selected mask-ROM cells in the reserved portion of said second memory array comprise no data layer.

6. The mask-ROM family according to claim 1, wherein the total number of the mask-ROM cells in the reserved portion is more than 10% of the total number of the mask-ROM cells in said first memory array.

7. The mask-ROM family according to claim 1, wherein the total number of the mask-ROM cells in the reserved portion is more than 10% of the total number of the mask-ROM cells in said second memory array.

8. The mask-ROM family according to claim 1, wherein each of said first and second mask-ROM dice further comprises an address translator.

9. The mask-ROM family according to claim 8, wherein said address translator comprises a non-volatile memory for storing an address-mapping table.

10. The mask-ROM family according to claim 9, wherein said non-volatile memory is a re-writable memory.

11. The mask-ROM family according to claim 10, wherein said re-writable memory is a flash memory.

* * * * *